United States Patent
Zhao et al.

(10) Patent No.: US 9,590,567 B2
(45) Date of Patent: Mar. 7, 2017

(54) MOVING MEAN AND MAGNITUDE DUAL PATH DIGITAL PREDISTORTION

(71) Applicant: Xilinx, Inc., San Jose, CA (US)

(72) Inventors: Hongzhi Zhao, Los Gatos, CA (US); Christopher H. Dick, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 14/790,364

(22) Filed: Jul. 2, 2015

(65) Prior Publication Data

US 2017/0005627 A1  Jan. 5, 2017

(51) Int. Cl.
| | | |
|---|---|---|
| H04K 1/02 | (2006.01) | |
| H03F 1/32 | (2006.01) | |
| H03F 3/189 | (2006.01) | |
| H03F 3/24 | (2006.01) | |
| H04B 1/04 | (2006.01) | |

(52) U.S. Cl.
CPC ......... *H03F 1/3247* (2013.01); *H03F 1/3252* (2013.01); *H03F 3/189* (2013.01); *H03F 3/24* (2013.01); *H04B 1/0475* (2013.01); *H03F 2201/3215* (2013.01); *H03F 2201/3233* (2013.01); *H04B 2001/0425* (2013.01)

(58) Field of Classification Search
CPC .............................. H03F 1/3247; H04L 27/368
USPC .......................................................... 375/296
See application file for complete search history.

(56) References Cited

U.S. PATENT DOCUMENTS

| | | |
|---|---|---|
| 6,507,220 B1 | 1/2003 | Groen et al. |
| 6,690,202 B1 | 2/2004 | Groen et al. |
| 7,308,632 B1 | 12/2007 | Verma et al. |
| 7,376,205 B1 | 5/2008 | Black |
| 7,737,779 B2 | 6/2010 | Summerfield et al. |
| 7,741,906 B1 | 6/2010 | Summerfield |
| 7,746,167 B1 | 6/2010 | Summerfield |
| 8,229,025 B1 | 7/2012 | Summerfield |
| 8,243,852 B1 | 8/2012 | Summerfield |
| 8,285,770 B1 | 10/2012 | Barnes et al. |
| 8,666,336 B1 | 3/2014 | Dick |
| 8,724,764 B2 | 5/2014 | Guasti et al. |
| 8,737,523 B2 | 5/2014 | Barnes |
| 8,913,688 B1 | 12/2014 | Jenkins |
| 9,014,241 B2 | 4/2015 | Dick |

(Continued)

OTHER PUBLICATIONS

Specification and drawings for U.S. Appl. No. 14/791,096, filed Jul. 2, 2015, Dick et al.

*Primary Examiner* — Dac Ha
*Assistant Examiner* — Janice Tieu
(74) *Attorney, Agent, or Firm* — W. Eric Webostad

(57) ABSTRACT

An apparatus relates generally to preconditioning an input signal. In this apparatus, a first digital predistortion module and a second digital predistortion module are for receiving the input signal for respectively providing a first predistorted signal and a second predistorted signal. A combiner is for combining the first predistorted signal and the second predistorted signal for providing an output signal. The first digital predistortion module includes a moving mean block for receiving the input signal for providing a moving mean signal. The first digital predistortion module further includes a digital predistorter for receiving the input signal and the moving mean signal for providing the first predistorted signal.

18 Claims, 7 Drawing Sheets

(56) References Cited

U.S. PATENT DOCUMENTS

| | | |
|---|---|---|
| 9,172,409 B2 | 10/2015 | Copeland |
| 9,264,211 B1 | 2/2016 | Jenkins |
| 9,337,886 B1 | 5/2016 | Dick |
| 9,338,039 B1 | 5/2016 | Barnes |
| 2005/0116775 A1 | 6/2005 | McBeath et al. |
| 2005/0190857 A1 | 9/2005 | Braithwaite |
| 2010/0048149 A1* | 2/2010 | Tang .................... H03F 1/3247 455/114.3 |
| 2011/0163806 A1 | 7/2011 | Hongo |
| 2015/0049841 A1* | 2/2015 | Laporte ................ H04B 1/0475 375/297 |

* cited by examiner

MOVING MEAN AND MAGNITUDE DUAL PATH DIGITAL PREDISTORTION

TECHNICAL FIELD

The following description relates to integrated circuit devices ("ICs"). More particularly, the following description relates to moving mean and magnitude dual path digital predistortion for an IC.

BACKGROUND

In cellular or wireless communication, modulation used in 4G or LTE systems for example has caused higher levels of saturation in base station power amplifiers than for example 2G modulation. This saturation has meant having to use a cavity filter with a substantial amount of attenuation, such as for example approximately a 30 dB attenuation. Accordingly, this has meant having to use more expensive cavity filters in 4G systems.

Moreover, for a multi-carrier/multi-band application, including without limitation a multi-radio application, such saturation has meant having to use a separate power amplifier and cavity filter path for each band. Along those lines, amplifier saturation rolloff may be too large in some instances to make it practical to have two bands in a same cavity filter envelope.

Hence, it is desirable and useful to provide signal preconditioning prior to input to a power amplifier that overcomes or mitigates one or more of the above-described limitations.

SUMMARY

An apparatus relates generally to preconditioning an input signal. In such an apparatus, a first digital predistortion module and a second digital predistortion module are for receiving the input signal for respectively providing a first predistorted signal and a second predistorted signal. A combiner is for combining the first predistorted signal and the second predistorted signal for providing an output signal. The first digital predistortion module includes a moving mean block for receiving the input signal for providing a moving mean signal. The first digital predistortion module further includes a digital predistorter for receiving the input signal and the moving mean signal for providing the first predistorted signal.

A system relates generally to transmission. In such a system, a signal preconditioning block is for receiving an input signal for providing an output signal. The output signal is a digitally predistorted version of the input signal. A signal conversion front end is for receiving the output signal for providing an analog signal. A power amplifier is for receiving the analog signal for providing an amplified signal. A cavity filter is for receiving the amplified signal for providing a filtered signal. A signal adaptation block is for receiving the amplified signal and the input signal for providing a first feedback signal and a second feedback signal to the signal preconditioning block. The first feedback signal is for updating first predistortion coefficients for a moving mean of the input signal. The second feedback signal is for updating second predistortion coefficients for an instantaneous amplitude magnitude of the input signal.

A method relates general to data transmission. In such a method, an input signal and a first feedback signal are received by a first digital predistortion module for providing a first predistorted signal by the first digital predistortion module. The input signal and a second feedback signal are received by a second digital predistortion module for providing a second predistorted signal by the second digital predistortion module. A combiner combines the first predistorted signal and the second predistorted signal for providing an output signal. The first predistorted signal is provided by: receiving the input signal by a moving mean block of the first digital predistortion module for providing a moving mean signal; and receiving the input signal and the moving mean signal by a digital predistorter of the first digital predistortion module for providing the first predistorted signal.

Other features will be recognized from consideration of the Detailed Description and Claims, which follow.

BRIEF DESCRIPTION OF THE DRAWINGS

Accompanying drawings show exemplary apparatus(es) and/or method(s). However, the accompanying drawings should not be taken to limit the scope of the claims, but are for explanation and understanding only.

FIG. 4-1 is a signal diagram depicting an exemplary single-band filtered signal.

FIG. 4-2 is a signal diagram depicting an exemplary multi-carrier/multi-band filtered signal.

DETAILED DESCRIPTION

Figure 1:
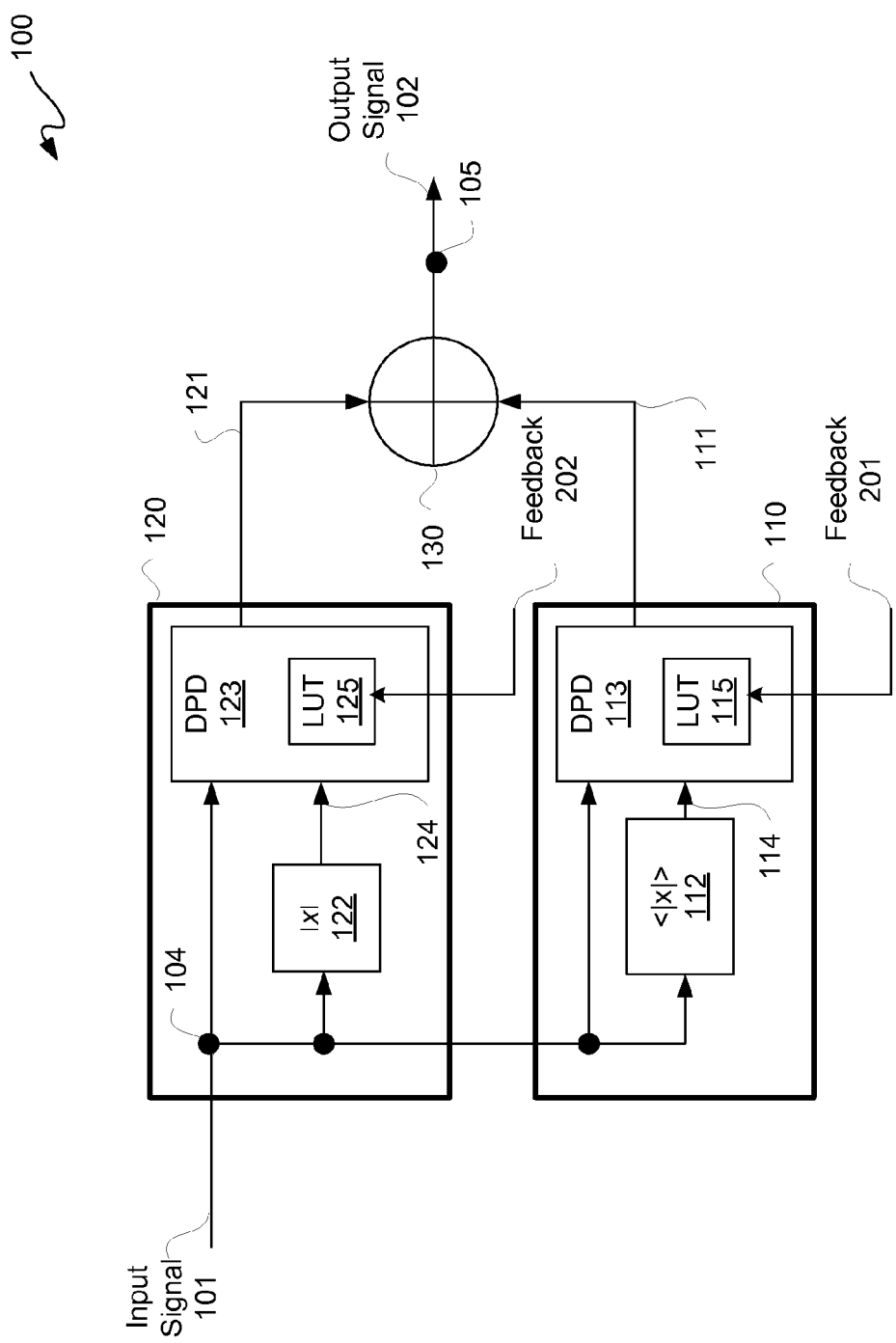
FIG. 1 is a block diagram depicting an exemplary signal preconditioning block.

In the following description, numerous specific details are set forth to provide a more thorough description of the specific examples described herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same number labels are used in different diagrams to refer to the same items; however, in alternative examples the items may be different.

Before describing the examples illustratively depicted in the several figures, a general introduction is provided to further understanding.

Digital predistortion is used to predistort an input signal prior to amplification by a power amplifier, such as of a wireless base station or other transmitter. For example, in a conventional digital predistorter, instantaneous magnitude of a transmission waveform envelope, namely a value of a signal envelope, together with a complex input signal itself was delivered to a nonlinear filter to realize a digital predistortion function. Coefficients of such a digital predistorter were periodically adapted based on a least mean squares process driven by such an input signal and sampled data from power amplifier output. Accordingly, a Least Mean Squares ("LMS") feedback to populate and update predistortion coefficients for a digital predistorter was only for instantaneous absolute values of amplitudes of an input signal using feedback from output of a power amplifier for comparison, namely to determine an error in such filter coefficients. Many companies produce ASSPs, SoC, and other ICs for providing digital predistortion. Unfortunately, even with this digital predistortion, saturation of an output of a power amplifier for a 4G or LTE modulated input signal was substantially greater than that for example a 2G modulated signal.

However, as described below in additional detail, digital predistortion is provided using both instantaneous absolute values of amplitudes as well as a moving mean therefor in parallel to provide a digitally predistorted signal. Along those lines, an RF signal chain for delivering an RF signal to a power amplifier may be influence by linearization performance of such power amplifier. A first-order effect of power amplifier linearity may be the amount of what is termed "memory" of a power amplifier. Examples of causes of memory effects in a power amplifier may be: junction heating/cooling in one or more power transistors thereof in response to changes in an input signal power level, transistor drain modulation effects related to imperfect decoupling, and/or imperfect input and/or output transmission line matching networks in such power amplifier.

A digital predistortion performance metric that quantifies reduction in spectral regrowth is known as Adjacent Channel Leakage Ratio ("ACLR"). By having two digital predistortion datapaths as described below in additional detail, an overall predistortion datapath is effectively extended for enhanced accommodation to power amplifier memory. Addition of a second nonlinear filter of a second datapath that operates in parallel with such first datapath may substantially reduce power amplifier saturation by this accommodation. For example, output of a power amplifier for a 4G modulated signal may be at approximately a 2G modulated signal power amplifier output saturation level or less.

This reduction in output saturation level allows for less costly cavity filters. Moreover, in the past cavity filters were manually tuned for each application of a power amplifier. However, with substantially less saturation in power amplifier output, this manual tuning of cavity filters may be avoided or at least substantially reduced.

With the above general understanding borne in mind, various configurations for signal preconditioning are generally described below.

FIG. 1 is a block diagram depicting an exemplary signal preconditioning block 100. Signal preconditioning block 100 is for preconditioning an input signal 101 using dual datapath digital predistortion as described herein.

Signal preconditioning block 100 includes a digital predistortion module 110 and a digital predistortion module 120 for receiving an input signal 101 for respectively providing a predistorted signal 111 and a predistorted signal 121. Signal preconditioning block 100 includes a signal combiner ("combiner") 130 for combining predistorted signal 111 and predistorted signal 121 for providing an output signal 102.

Digital predistortion module 110 and digital predistortion module 120 may be commonly coupled at an input node 104 and an output node 105 to provide dual digital predistortion datapaths, as described below in additional detail. Input signal 101 and output signal 102 are respective digital signals.

Digital predistortion module 110 includes: a moving mean block 112 for receiving input signal 101 for providing a moving mean signal 114; and a digital predistorter 113 for receiving input signal 101 and moving mean signal 114 for providing predistorted signal 111. Digital predistortion module 120 includes: an absolute value block 122 for receiving input signal 101 for providing a magnitude signal 124; and a digital predistorter 123 for receiving input signal 101 and magnitude signal 124 for providing predistorted signal 121. As digital predistortion module 120 is conventional, digital predistortion module 120 is not described in unnecessary detail herein.

Digital predistorter ("DPD") 113 includes a lookup table 115 for receiving moving mean signal 114 as an index to lookup table 115 for providing predistorted signal 111. Digital predistorter 123 includes a lookup table ("LUT") 125 for receiving magnitude signal 124 as an index to lookup table 125 for providing predistorted signal 121. Digital predistorter 113 and digital predistorter 123 may be realized as respective nonlinear filters.

Along those lines, LUT 115 may store a set of predistortion coefficients, which are filter coefficients for a nonlinear filter, such as a Volterra nonlinear filter for example. Likewise, LUT 125 may store another set of predistortion coefficients, which are filter coefficients for another nonlinear filter, such as another Volterra nonlinear filter for example. In an implementation, DPD 113 and DPD 123 may be respective pruned Volterra nonlinear filters.

Moving mean block 112 is configured for providing moving mean signal 114 for N samples or values of input signal 101. For example, a moving mean, which sometimes is referred to as a running average, of amplitude magnitudes of an input signal, x, 101, may be obtained for k from $-N/2$ to $N/2$ samples of a digital signal $x(n)$, so a moving mean $<|x|>$ may equal a summation of terms $|x(n-k)|$ divided by N samples. For example, moving mean block 112 may be implemented with a counter coupled to count N samples, an absolute value circuit coupled to sample an input signal 101 to provide absolute values of amplitudes of x, an accumulator coupled to accumulate absolute values of x to provide sums therefor, and a divider coupled to divide output of such accumulator by N output from such counter. Accordingly, such a moving mean block 112 may be configured to provide a moving mean signal over N absolute sample values of an input signal, x, 101. By using an absolute value of x and inputs signal, x, 101, DPDs 113, as well as DPD 123, operate on both input signal, x, 101 as well as a complex envelope of input signal, x, 101.

A moving mean value may be output from moving mean block 112 by moving mean signal 114. Such a moving mean value of moving mean signal 114 may be used as an index or pointer to a set of predistortion coefficients of sets of predistortion coefficients stored in LUT 115. Thus, a set of predistortion coefficients or filter coefficients may be selected from LUT 115 responsive to such index or pointer value.

LUTs 115 and 125 may have same structures; however, sets of coefficients, which are stored in such LUTs, are different for these different instances of nonlinear filters used to realize DPDs 113 and 123, respectively. Furthermore, a filter function of DPD 113 is for a moving mean $|<x>|$ variable, and a filter function of DPD 123 is for an absolute value $|x|$, namely an instantaneous magnitude of an amplitude of input signal, x, 101.

Because DPDs 113 and 123 are coupled to a power amplifier, coefficients in LUTs 115 and 125, respectively, may be updated to adjust for error. Accordingly, feedback signals 201 and 202 respectively input to LUTs 115 and 125 may provide update information, as described below in additional detail. Furthermore, degree of variability of a power amplifier or tolerances of an application may likewise translate to number of samples N to be used.

Generally, a moving mean value may be for a short-term average of input signal, x, 101. Along those lines, absolute sample values used may be for N an integer in a range of approximately 4 to 20 as associated with a power amplifier parameter. This short-term average is in a way a proxy for amplifier memory of a power amplifier. In another implementation, such absolute sample values used may be for N an integer in a range of approximately 2 to 300 as associated with a power amplifier parameter.

Predistorted signals 111 and 121 may thus have different predistortion outcomes, and these different outcomes may be combined by combiner 130 to provide an output signal 102, which is a predistorted version of input signal 101. However, output signal 102 is not the same as a conventionally predistorted signal, namely not the same as predistorted signal 121. While not wishing to be bound by theory, it is believed that output signal 102 in some instances may deliver up to a 4 dB improvement in ACLR power amplifiers that exhibit significant "wideband" memory effects. This is a substantial increased in a field where improvements on the order of 0.5 dB are deemed significant.

Efficiency, namely effectiveness of converting input DC power to RF energy, by a power amplifier ("PA"), such as in a wireless basestation, may be a significant consideration for wireless infrastructure manufactures and operators. PA efficiency has implications for CAPEX, OPEX, physical size, and coverage provided a basestation radio. Digital predistortion may be used by for example remote radio units (RRU) to improve efficiency and provide options for making tradeoffs involving cost, power, coverage, and size. Linearization performance, as measured for example in terms of power added efficiency and improvement in adjacent channel power ratio (ACPR), may be a function of a signal processing chain and/or output power level, and such linearization performance may be tightly coupled to characteristics of a power amplifier used. Some power amplifiers are easier to linearize than others, and some power amplifiers involve significant tuning, including manual tuning of a cavity filter therefor. However, by providing a substantial reduction in PA output saturation, such as from a 4G level to a 2G level, with use of signal preconditioning block 100, less manual tuning of a power amplifier and/or a cavity filter therefor may be had.

Figure 2:
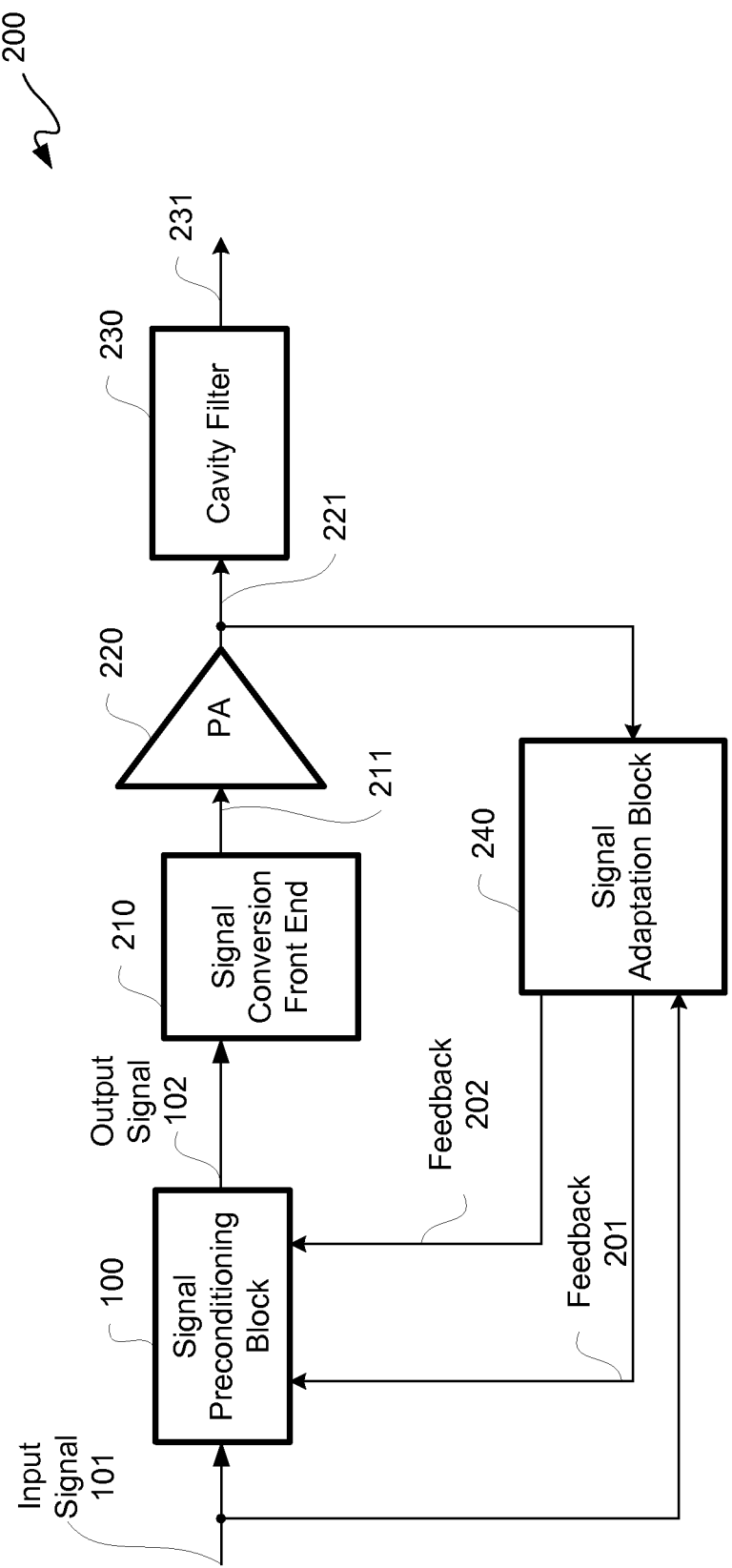
FIG. 2 is a block diagram depicting an exemplary transmission system for data transmission.

FIG. 2 is a block diagram depicting an exemplary transmission system 200 for data transmission. Transmission system 200 includes a signal preconditioning block 100 for receiving an input signal 101 for providing an output signal 102, where output signal 102 is a digitally predistorted version of input signal 10 as previously described.

Transmission system 200 includes: a signal conversion front end 210 for receiving output signal 102 for providing an analog signal 211; a power amplifier 220 for receiving analog signal 211 for providing an amplified signal 221; a cavity filter 230 for receiving amplified signal 221 for providing a filtered signal 231; and a signal adaptation block 240 for receiving amplified signal 221 and input signal 101 for providing a feedback signal 201 and a feedback signal 202 to signal preconditioning block 100. Transmission system 200 is further described with simultaneous reference to FIGS. 1 and 2.

Signal conversion front end 210 between output node 105 of signal preconditioning block 100 and an input to PA 220 may be conventional. Along those lines, signal conversion front end 210 may include a digital-to-analog converter ("D/A") for converting a digital output signal 102 to an analog signal. Signal conversion front end 210 may include an RF mixer and an RF modulator, as well as other known components. Accordingly, signal conversion front end 210 is not described in unnecessary detail herein for purposes of clarity and not limitation.

Analog signal 211 output from signal conversion front end 210 for input to PA 211 may be a DC input which is converted to RF energy as amplified signal 221. Cavity filter 230 may filter amplified signal 221 to provide a cavity filtered signal ("filtered signal") 231 for subsequent transmission.

Figures 1, 4:
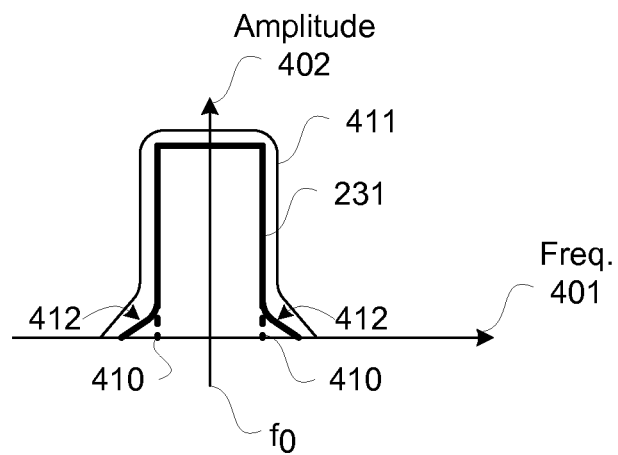
Figures 2, 4:
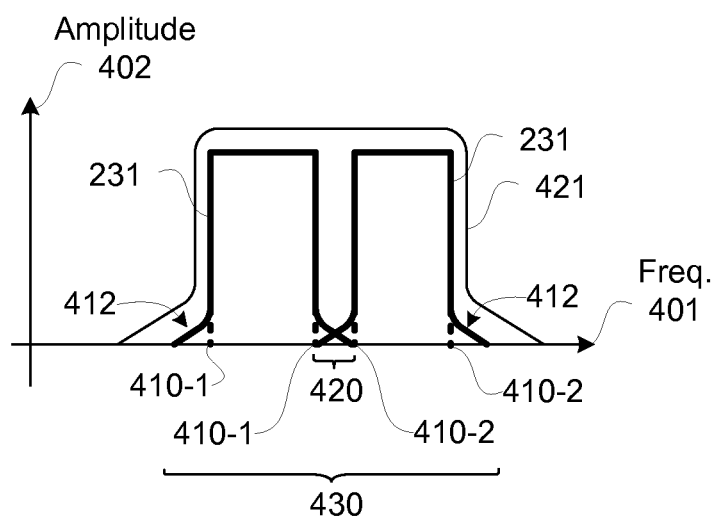

FIG. 4-1 is a signal diagram depicting an exemplary single-band filtered signal 231. In this example, x-axis 401 is for frequency, and y-axis 402 is for amplitude. In this example, input signal 101 is a single-banded signal, so filtered signal 231 has a single band, generally represented by a frequency band 410 centered at frequency $f_0$, within a cavity envelop 411. However, because of PA saturation, saturation rolloff 412 causes frequency band 410, namely transmission spectrum to be transmitted for communication of data, to be larger than ideal. Cavity filter 230 provides a cavity envelope 411 which limits this saturation rolloff to limit or avoid inter-band interference.

However, because saturation rolloff may be at a 2G level or less, as compared to a much higher 4G level, cavity filter 230 may provide substantially less suppression for suppressing such saturation rolloff. In the past, a cavity filter may provide approximately 30 dB suppression; however, cavity filter 230 may provide approximately 10 dB or less rolloff suppression for a 4G modulated filtered signal 231. Along those lines, cavity filter 230 may be approximately a 5 dB rolloff suppression or attenuation cavity filter for some applications.

FIG. 4-2 is a signal diagram depicting an exemplary multi-carrier/multi-band filtered signal 231. In this example, x-axis 401 is for frequency, and y-axis 402 is for amplitude. In this example, input signal 101 is a double-banded signal, so filtered signal 231 has a first band 410-1 and a second band 410-2. In this example, such bands may be translated away from a frequency, $f_0$, such as for having multiple bands on a same carrier. Moreover, such other bands may be for a same or different modulation and/or bandwidth, such as for multi-carrier/multi-band radio for example.

Filtered signal 231 may be bounded by a cavity envelop 421. However, because of PA saturation, saturation rolloff 412 causes frequency bands 410-1 and 410-2 to be larger than ideal. Cavity filter 230 provides a cavity envelope 421 which limits this saturation rolloff to limit or avoid inter-band interference, such as previously described. However, because such PA saturation is substantially less, a single cavity filter 230 and a single PA paired therewith may be used for a multi-carrier/multi-band input signal 101. Along those lines, for such substantially reduced PA saturation rolloff 412, an inter-band interference region 420 for neighboring bands, such as frequency bands 410-1 and 410-2 for example, may be sufficiently narrow such that overall bandwidth 430 of filtered signal 231, including outer saturation rolloffs 412, may be suitable for a single cavity filter.

Returning to system 200 of FIG. 2, PA 220 and cavity filter 230 may be respective single instances thereof for processing a multi-carrier/multi-band input signal 101 for a 4G modulation. Saturation rolloff or nonlinearity leakage 412 may thus result in single PA-cavity filter transmission path for a multi-carrier/multi-band input signal 101, rather than having a PA-cavity filter transmission path for each band. Thus, not only can a less expensive cavity filter 230 be used, but also fewer PA-cavity filter pairs may be used for multi-carrier/multi-band applications. Even though only two bands were illustratively depicted, more than two bands for an input signal 101 may be used.

With simultaneous reference to FIGS. 1 and 2, LUTs 115 and 125 may initially not be populated with predistortion coefficients. However, with a prior knowledge of a PA to be used with signal preconditioning block 100, LUTs 115 and 125 may be populated with some initial starting sets of predistortion coefficients. However, assuming LUTs 115 and 125 are not initially populated, LUTs 115 and 125 may each be populated with at least one set of predistortion coefficients different from one another. Accordingly, updating LUTs 115 and 125 may include going from no initial predistortion coefficients to adaptively providing initial sets of predistortion coefficients for each of LUTs 115 and 125. Initial predistortion coefficients may be subsequently updated using feedback signals 201 and 202.

Figure 3:
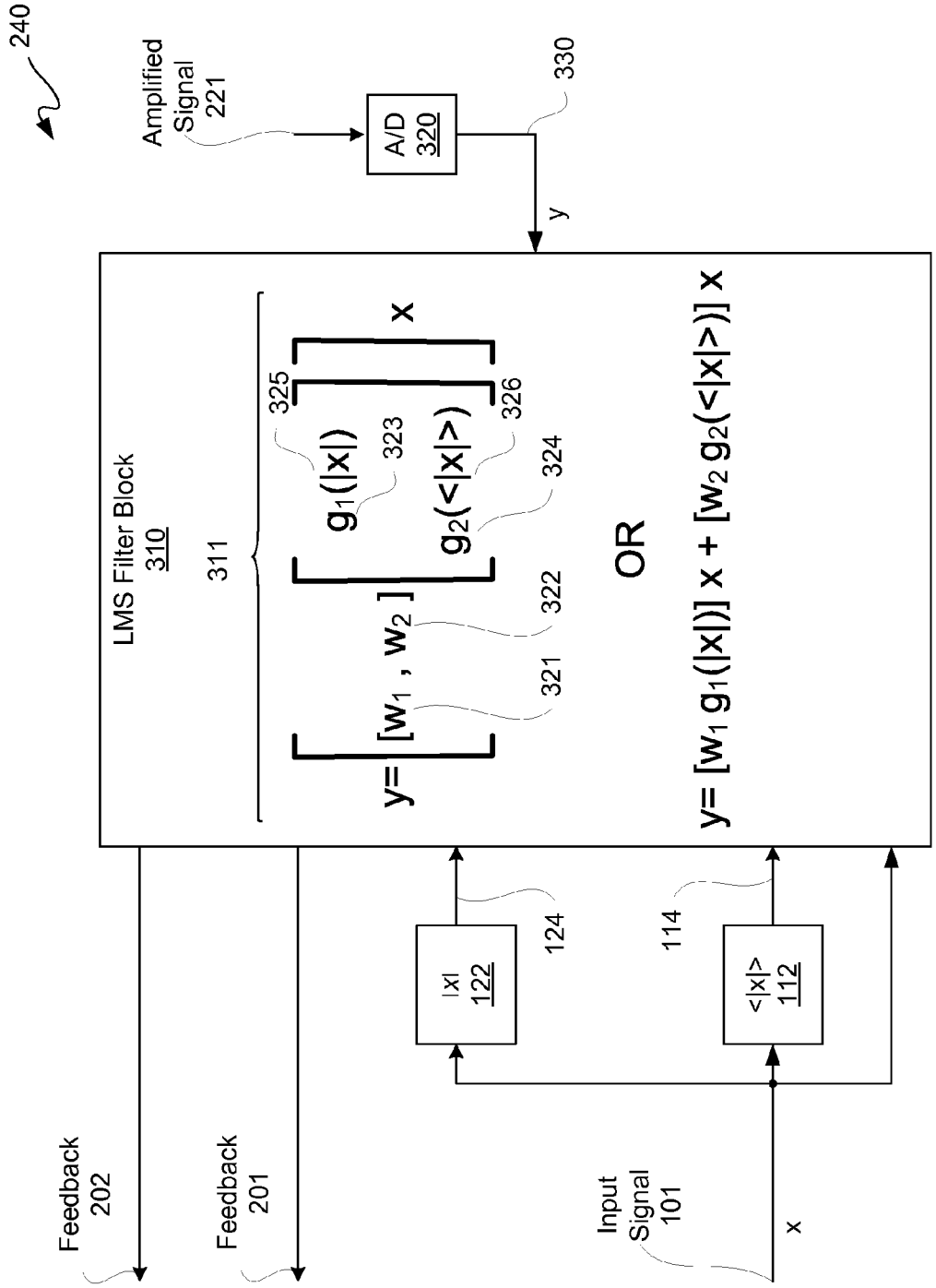
FIG. 3 is block diagram depicting an exemplary signal adaptation block.

Along the above lines, FIG. 3 is block diagram depicting an exemplary signal adaptation block 240. Signal adaptation block 240 may include at least one Least Mean Squares ("LMS") filter block 310 and an analog-to-digital converter ("ND"). Signal adaptation block 240 may include separate instances of moving mean block 112 and absolute value block 122 from those instances in signal preconditioning block 100. However, in another implementation, moving mean signal 114 and magnitude signal 124 may be respectively sourced from signal preconditioning block 100. With simultaneous reference to FIGS. 1 through 3, signal adaptation block 240 is further described.

Amplified signal 221 may be fed back from output of PA 220 to input to ND 320 for providing a digital output signal, y, 330. ND 320 may include other known components for conversion of amplified signal 221 to a digital output signal, y, 330, as is known, and accordingly not described for purposes of clarity and not limitation.

In this example, digital input signal, x, 101, and a corresponding digital output signal, y, 330 are input to a unified LMIS filter block 310. Delays for having correspondence between associated signals are not illustratively depicted for purposes of clarity and not limitation. Input signal, x, 101 is input to moving mean block 112 and absolute value block 122 to respectively obtain digital moving mean signal 114 and digital magnitude signal 124 corresponding to digital input signal, x, 101, and digital output signal, y, 330 for input to a unified LMIS filter block 310. Again, delays for having correspondence between associated signals are not illustratively depicted for purposes of clarity and not limitation.

In this example, LMS filter block 310 is configured for providing both feedback signals 201 and 202; however, in another implementation, separate LMS filter blocks 310 may be used for separately processing digital moving mean signal 114 and digital magnitude signal 124, as will be appreciated in more detail from the following description of a single LMS filter block 310.

Feedback signal 201 may be for updating predistortion coefficients 322 for a moving mean 326 of input signal, x, 101, and feedback signal 202 may be for updating predistortion coefficients 321 for an instantaneous amplitude magnitude 325 of input signal 101. Along those lines, output signal y may equal filter coefficients w multiplied by input signal x, or y=wx. An error may thus be described as a difference between input signal x and output signal y, or err=x-y. This error may reflect how predistortion coefficients used in signal preconditioning block 100 are to be adjusted or updated for adaptation to PA 220.

LMS filter block 310 may be configured to provide an LMS filter using a nonlinear filter, such as a Volterra nonlinear filter. Along those lines, LMS filter block 310 may be configured to provide a filter function 311, where $w_1$ and $w_2$ are respective sets of filter or predistortion coefficients 321 and 322 different from one another for nonlinear filter functions 323 and 324, respectively. Filter function 311 may be configured to have a nonlinear filter function, $g_2$, 324 as a function of moving mean, $|\langle x \rangle|$, 326 obtained from moving mean signal 114 for multiplying with predistortion coefficients 322 associated therewith. Filter function 311 may be further configured to have a nonlinear filter function, $g_1$, 323 as a function of instantaneous amplitude magnitude, $|x|$, 325 obtained from magnitude signal 124 for multiplying with predistortion coefficients 321. Again, moving mean 326 is for a running mean of amplitude magnitudes of input signal 101.

Accordingly, as x, y, $|\langle x \rangle|$, and $|x|$ may all be actual values, such equality of filter function 311 may be used for generating predistortion coefficients, $w_1$, 321 and predistortion coefficients, $w_2$, 322 including updates to predistortion coefficients used for providing output signal y 330 based on such equality. In other words, values for $w_1$ and $w_2$ may be determined which make x=y, or at least approximately equal to one another. Such determined predistortion coefficients 321 may be fed back as feedback signal 202, and such determined predistortion coefficients 322 may be fed back as feedback signal 201. In other words, $w_1 \, g_1(|x|)$ and $w_2 \, g_2(\langle |x| \rangle)$ are respective nonlinear gains of PA 220 as functions of $|x|$ and $\langle |x| \rangle$, respectively.

Figure 5:
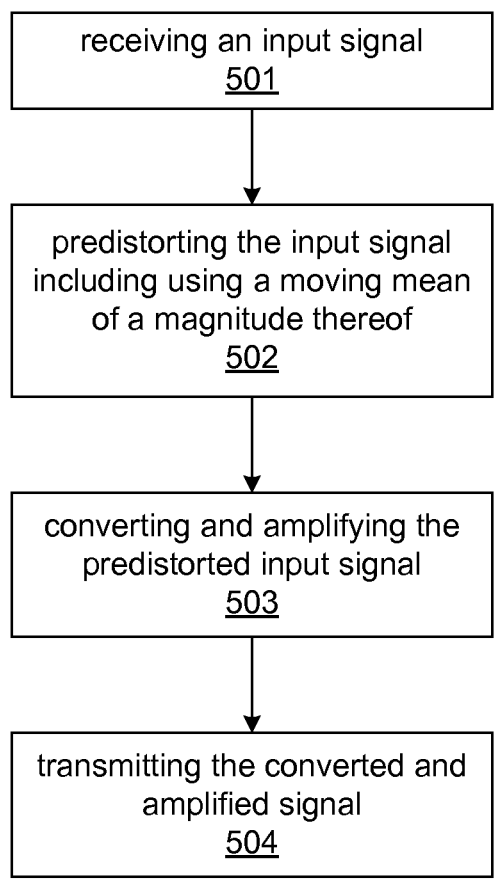
FIG. 5 is a flow diagram depicting an exemplary data transmission flow.

FIG. 5 is a flow diagram depicting an exemplary data transmission flow 500. Data transmission flow 500 may be used for transmission of data as described herein.

At 501, an input signal 101 may be received for subsequent transmission. At 502, such input signal 101 received at 501 may be predistorted, including using a moving mean of a magnitude of such input signal 101, as previously described elsewhere herein. At 503, such predistorted input signal obtained at 502 may be converted and amplified for subsequent transmission. At 504, such converted and amplified signal obtained at 503 may be transmitted.

Figure 6:
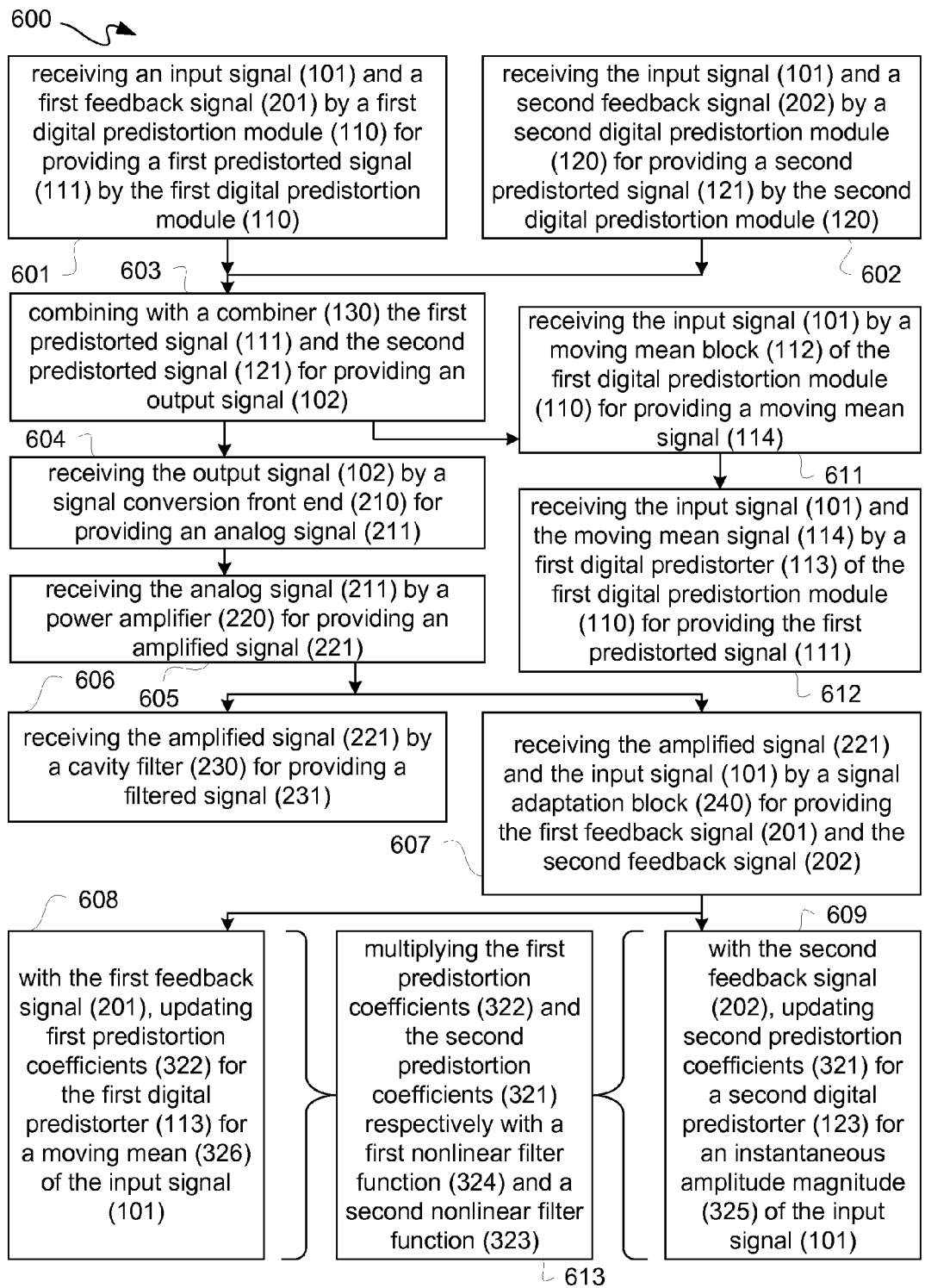
FIG. 6 is a flow diagram depicting an exemplary data transmission flow for the data transmission flow of FIG. 5.

FIG. 6 is a flow diagram depicting an exemplary data transmission flow 600. Data transmission flow 600 is an example of an implementation of data transmission flow 500 of FIG. 5; however, another implementation of data transmission flow 500 may be used in accordance with the description herein. Data transmission flow 600 is further described with simultaneous reference to FIGS. 1 through 6.

At 601, an input signal 101 and a feedback signal 201 may be received by a digital predistortion module 110 for providing a predistorted signal 111 by digital predistortion module 110. Generally at the same time, at 602 input signal 101 and a feedback signal 202 may be received by a digital predistortion module 120 for providing a predistorted signal 121 by digital predistortion module 120.

At 603, predistorted signal 111 and predistorted signal 121 may be combined with a combiner 130 for providing an output signal 102. Along those lines, operation at 603 may include operations 611 and 612 for providing predistorted signal 111. At 611, input signal 101 may be received by a moving mean block 112 of digital predistortion module 110 for providing a moving mean signal 114. At 612, input signal 101 and moving mean signal 114 may be received by a digital predistorter 113 of digital predistortion module 110 for providing predistorted signal 111.

At 604, output signal 102 may be received by a signal conversion front end 210 for providing an analog signal 211. At 605, analog signal 211 may be received by a power amplifier 220 for providing an amplified signal 221.

At 606, amplified signal 221 may be received by a cavity filter 230 for providing a filtered signal 231. Generally, at the same time, at 607, amplified signal 221 and input signal 101 may be received by a signal adaptation block 240 for providing feedback signal 201 and feedback signal 202. Amplified signal 221 may be fed back to signal adaptation block 240; however, amplified signal 221 is not necessarily continuous sampled by signal adaptation block 240. Along those lines, signal adaptation block 240 may periodically sample amplified signal 221 for providing a digital output signal, y, 330.

At 608, with feedback signal 201, predistortion coefficients 322 may be updated for digital predistorter 113 for a moving mean 326 of input signal 101. Generally at the same time, at 609, with feedback signal 202, predistortion coefficients 321 may be updated for a digital predistorter 123 for an instantaneous amplitude magnitude 325 of input signal 101.

Updating of predistortion coefficients 322 at 608 and updating of predistortion coefficients 321 at 609 may include operation 613. At 613, predistortion coefficients 322 and predistortion coefficients 321 may be respectively multiplied with a nonlinear filter function 324 and a nonlinear filter function 323.

Nonlinear filter function 323 may be different from nonlinear filter function 324. Along those lines, nonlinear filter function 324 is a function of moving mean 326, and nonlinear filter function 323 is a function of instantaneous amplitude magnitude 325. Again, moving mean 326 is for amplitude magnitudes of input signal 101.

Because one or more of the examples described herein may be implemented in an FPGA, a detailed description of such an IC is provided. However, it should be understood that other types of ICs may benefit from the technology described herein.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

Figure 7:
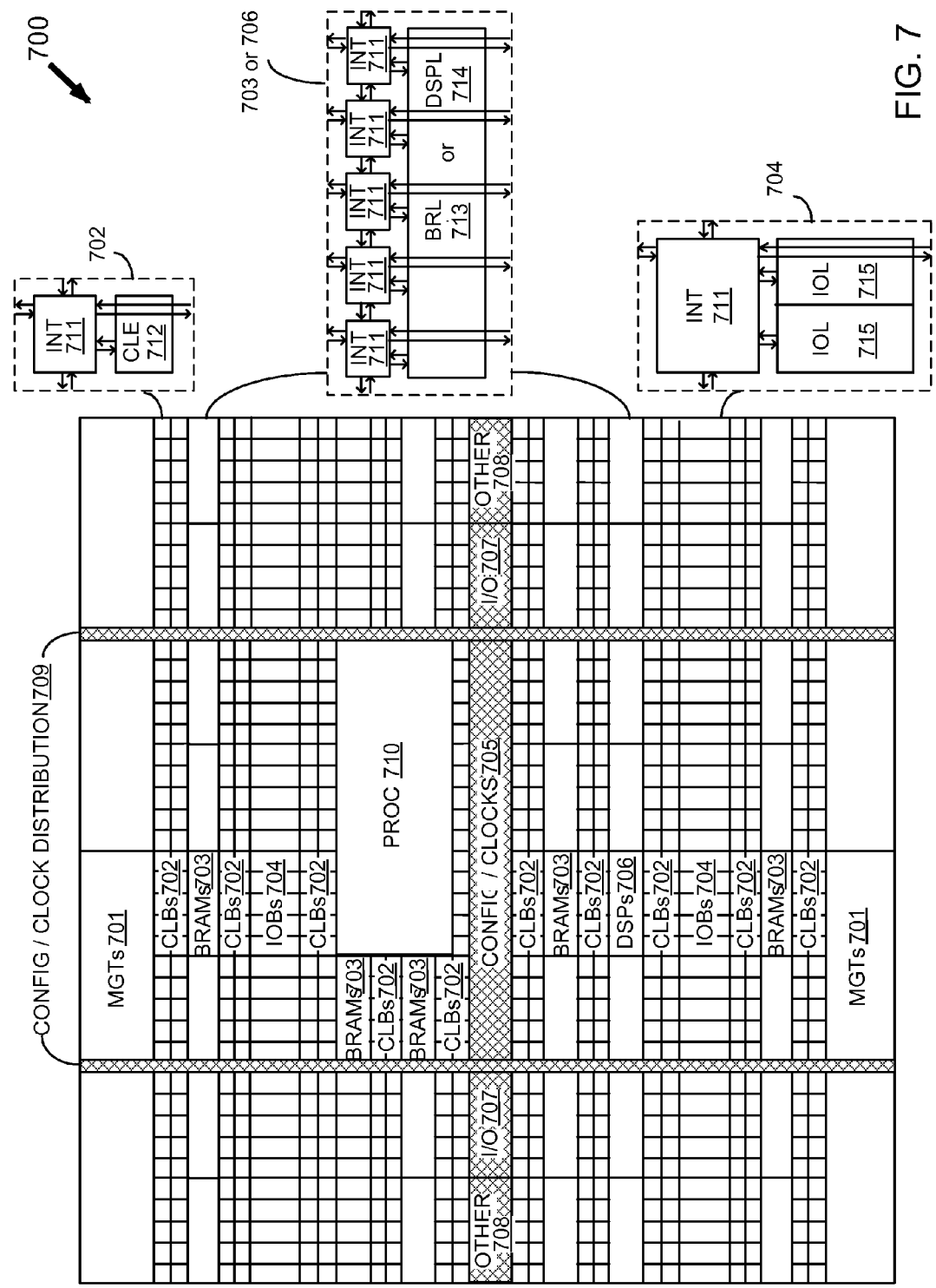
FIG. 7 is a simplified block diagram depicting an exemplary columnar Field Programmable Gate Array ("FPGA") architecture.

As noted above, advanced FPGAs can include several different types of programmable logic blocks in the array. For example, FIG. 7 illustrates an FPGA architecture 700 that includes a large number of different programmable tiles including multi-gigabit transceivers ("MGTs") 701, configurable logic blocks ("CLBs") 702, random access memory blocks ("BRAMs") 703, input/output blocks ("IOBs") 704, configuration and clocking logic ("CONFIG/CLOCKS") 705, digital signal processing blocks ("DSPs") 706, specialized input/output blocks ("I/O") 707 (e.g., configuration ports and clock ports), and other programmable logic 708 such as digital clock managers, analog-to-digital converters, system monitoring logic, and so forth. Some FPGAs also include dedicated processor blocks ("PROC") 710.

In some FPGAs, each programmable tile includes a programmable interconnect element ("INT") 711 having standardized connections to and from a corresponding interconnect element in each adjacent tile. Therefore, the programmable interconnect elements taken together implement the programmable interconnect structure for the illustrated FPGA. The programmable interconnect element 711 also includes the connections to and from the programmable logic element within the same tile, as shown by the examples included at the top of FIG. 7.

For example, a CLB 702 can include a configurable logic element ("CLE") 712 that can be programmed to implement user logic plus a single programmable interconnect element ("INT") 711. A BRAM 703 can include a BRAM logic element ("BRL") 713 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 706 can include a DSP logic element ("DSPL") 714 in addition to an appropriate number of programmable interconnect elements. An 10B 704 can include, for example, two instances of an input/output logic element ("IOL") 715 in addition to one instance of the programmable interconnect element 711. As will be clear to those of skill in the art, the actual I/O pads connected, for example, to the I/O logic element 715 typically are not confined to the area of the input/output logic element 715.

In the pictured embodiment, a horizontal area near the center of the die (shown in FIG. 7) is used for configuration, clock, and other control logic. Vertical columns 709 extending from this horizontal area or column are used to distribute the clocks and configuration signals across the breadth of the FPGA.

Some FPGAs utilizing the architecture illustrated in FIG. 7 include additional logic blocks that disrupt the regular columnar structure making up a large part of the FPGA. The additional logic blocks can be programmable blocks and/or dedicated logic. For example, processor block 710 spans several columns of CLBs and BRAMs.

Note that FIG. 7 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 7 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

While the foregoing describes exemplary apparatus(es) and/or method(s), other and further examples in accordance with the one or more aspects described herein may be devised without departing from the scope hereof, which is determined by the claims that follow and equivalents thereof. Claims listing steps do not imply any order of the steps. Trademarks are the property of their respective owners.

What is claimed is:

1. An apparatus for preconditioning an input signal, comprising:
   a first digital predistortion module and a second digital predistortion module for receiving the input signal for respectively providing a first predistorted signal and a second predistorted signal; and
   a combiner for combining the first predistorted signal and the second predistorted signal for providing an output signal;
   wherein the first digital predistortion module comprises:
      a moving mean block for receiving the input signal for providing a moving mean signal; and
   a digital predistorter for receiving the input signal and the moving mean signal for providing the first predistorted signal, wherein the digital predistorter is a first digital predistorter:
   wherein the second digital predistortion module comprises:
      an absolute value block for receiving the input signal for providing a magnitude signal; and
      a second digital predistorter for receiving the input signal and the magnitude signal for providing the second predistorted signal.

2. The apparatus according to claim 1, wherein the input signal and the output signal are respective digital signals.

3. The apparatus according to claim 1, wherein:
   the first digital predistorter includes a first lookup table for receiving the moving mean signal as a first index to the first lookup table for providing the first predistorted signal; and
   the second digital predistorter includes a second lookup table for receiving the magnitude signal as a second index to the second lookup table for providing the second predistorted signal.

4. The apparatus according to claim 1, wherein the first digital predistorter and the second digital predistorter are a first nonlinear filter and a second nonlinear filter, respectively.

5. The apparatus according to claim 4, wherein the first nonlinear filter and the second nonlinear filter are respectively a first Volterra nonlinear filter and a second Volterra nonlinear filter.

6. The apparatus according to claim 5, wherein the first Volterra nonlinear filter and the second Volterra nonlinear filter are a first pruned Volterra nonlinear filter and a second pruned Volterra nonlinear filter, respectively.

7. The apparatus according to claim 1, wherein the moving mean block is configured for providing the moving mean signal over N absolute sample values of the input signal, wherein N is an integer number.

8. The apparatus according to claim 7, wherein the N absolute sample values are for a range from approximately 2 to 300.

9. A system for transmission, comprising:
   a signal preconditioning block for receiving an input signal for providing an output signal, the output signal being a digitally predistorted version of the input signal;
   a signal conversion front end for receiving the output signal for providing an analog signal;
   a power amplifier for receiving the analog signal for providing an amplified signal;
   a cavity filter for receiving the amplified signal for providing a filtered signal; and
   a signal adaptation block for receiving the amplified signal and the input signal for providing a first feedback signal and a second feedback signal to the signal preconditioning block;
   wherein the first feedback signal is for updating first predistortion coefficients for a moving mean of the input signal; and
   wherein the second feedback signal is for updating second predistortion coefficients for an instantaneous amplitude magnitude of the input signal.

10. The system according to claim 9, wherein the input signal is a multi-carrier or multi-band signal.

11. The system according to claim 10, wherein the cavity filter has less than approximately a 10 dB rolloff suppression.

12. The system according to claim 10, wherein the cavity filter is approximately a 5 dB rolloff suppression cavity filter.

13. The system according to claim 10, wherein the signal adaptation block comprises at least one Least Mean Squares ("LMS") filter block.

14. The system according to claim 13, wherein the at least one LMS filter block comprises:
   a first nonlinear filter function being a function of the moving mean for multiplying with the first predistortion coefficients; and
   a second nonlinear filter function being a function of the instantaneous amplitude magnitude for multiplying with the second predistortion coefficients.

15. The system according to claim 9, wherein the signal preconditioning block comprises:
   a first digital predistortion module for receiving the input signal and the first feedback signal for providing a first predistorted signal;

a second digital predistortion module for receiving the input signal and the second feedback signal for providing a second predistorted signal; and a combiner for combining the first predistorted signal and the second predistorted signal for providing the output signal.

16. A method for data transmission, comprising:

receiving an input signal and a first feedback signal by a first digital predistortion module for providing a first predistorted signal by the first digital predistortion module;

receiving the input signal and a second feedback signal by a second digital predistortion module for providing a second predistorted signal by the second digital predistortion module; and combining the first predistorted signal and the second predistorted signal with a combiner for providing an output signal;

wherein the first predistorted signal is provided by:
receiving the input signal by a moving mean block of the first digital predistortion module for providing a moving mean signal; and receiving the input signal and the moving mean signal by a digital predistorter of the first digital predistortion module for providing the first predistorted signal;

wherein the digital predistorter is a first digital predistorter, the method further comprising:

receiving the output signal by a signal conversion front end for providing an analog signal;

receiving the analog signal by a power amplifier for providing an amplified signal;

receiving the amplified signal by a cavity filter for providing a filtered signal; and receiving the amplified signal and the input signal by a signal adaptation block for providing the first feedback signal and the second feedback signal;

with the first feedback signal, updating first predistortion coefficients for the first digital predistorter for a moving mean of the input signal; and with the second feedback signal, updating second predistortion coefficients for a second digital predistorter for an instantaneous amplitude magnitude of the input signal.

17. The method according to claim 16, wherein the updating of the first predistortion coefficients and the updating of the second predistortion coefficients comprises:

multiplying the first predistortion coefficients and the second predistortion coefficients respectively with a first nonlinear filter function and a second nonlinear filter function;

wherein the first nonlinear filter function is a function of the moving mean;

wherein the second nonlinear filter function is a function of the instantaneous amplitude magnitude; and wherein the moving mean is for amplitude magnitudes of the input signal.

18. The method according to claim 16, wherein the input signal is a multi-carrier/multi-band signal.

* * * * *